United States Patent
Kannan et al.

(10) Patent No.: US 12,306,434 B2
(45) Date of Patent: May 20, 2025

(54) PHOTONIC WAFER COMMUNICATION SYSTEMS AND RELATED PACKAGES

(71) Applicant: Lightmatter, Inc., Boston, MA (US)

(72) Inventors: Sukeshwar Kannan, Chelmsford, MA (US); Carl Ramey, Westborough, MA (US); Jon Elmhurst, East Walpole, MA (US); Darius Bunandar, Boston, MA (US); Nicholas C. Harris, Menlo Park, CA (US)

(73) Assignee: Lightmatter, Inc., Boston, MA (US)

( * ) Notice: Subject to any disclaimer, the term of this patent is extended or adjusted under 35 U.S.C. 154(b) by 0 days.

(21) Appl. No.: 18/434,443

(22) Filed: Feb. 6, 2024

(65) Prior Publication Data
US 2024/0176066 A1    May 30, 2024

Related U.S. Application Data

(63) Continuation of application No. 17/165,157, filed on Feb. 2, 2021, now Pat. No. 11,947,164.
(Continued)

(51) Int. Cl.
*G02B 6/12*        (2006.01)
*G02B 6/42*        (2006.01)
(Continued)

(52) U.S. Cl.
CPC ............... *G02B 6/12* (2013.01); *H01L 23/50* (2013.01); *H05K 1/183* (2013.01); *G02B 6/4274* (2013.01);
(Continued)

(58) Field of Classification Search
CPC ......... G02B 6/12; G02B 6/4274; H01L 23/50; H01L 23/13; H01L 23/5383;
(Continued)

(56) References Cited

U.S. PATENT DOCUMENTS 5,416,861 A    5/1995    Koh et al.
5,771,323 A    6/1998    Trott
(Continued)

FOREIGN PATENT DOCUMENTS

EP    2 212 887 B1    4/2013
EP    3 159 721 A1    4/2017
(Continued)

OTHER PUBLICATIONS

Hayakawa, Machine Translation of JP 2018-195723 A, Dec. 6, 2018. (Year: 2018).*
(Continued)

*Primary Examiner* — Michelle R Connelly
(74) *Attorney, Agent, or Firm* — Wolf, Greenfield & Sacks, P.C.

(57) ABSTRACT

Described herein are photonic communication platforms and related packages. In one example, a photonic package includes a substrate carrier having a recess formed through the top surface of the substrate carrier. The substrate carrier may be made of a ceramic laminate. A photonic substrate including a plurality of photonic modules is disposed in the recess. The photonic modules may be patterned using a common photomask, and as a result, may share a same layer pattern. A plurality of electronic dies may be positioned on top of respective photonic modules. The photonic modules enable communication among the dies in the optical domain. Power delivery substrates may be used to convey electric power from the substrate carrier to the electronic dies and to the photonic substrate. Power delivery substrates may be implemented, for example, using bridge dies or interposers (e.g., silicon or organic interposers).

19 Claims, 14 Drawing Sheets

Related U.S. Application Data

(60) Provisional application No. 63/087,052, filed on Oct. 2, 2020, provisional application No. 62/969,373, filed on Feb. 3, 2020.

(51) Int. Cl.

| | | |
|---|---|---|
| *H01L 23/13* | (2006.01) | |
| *H01L 23/50* | (2006.01) | |
| *H01L 23/538* | (2006.01) | |
| *H01L 25/16* | (2023.01) | |
| *H05K 1/18* | (2006.01) | |

(52) U.S. Cl.
CPC .......... *H01L 23/13* (2013.01); *H01L 23/5383* (2013.01); *H01L 23/5384* (2013.01); *H01L 23/5385* (2013.01); *H01L 25/167* (2013.01); *H01L 2924/15153* (2013.01)

(58) Field of Classification Search
CPC ............. H01L 23/5384; H01L 23/5385; H01L 25/167; H01L 2924/15153; H01L 2224/16225; H05K 1/183
See application file for complete search history.

(56) References Cited

U.S. PATENT DOCUMENTS

| | | | |
|---|---|---|---|
| 5,930,429 | A | 7/1999 | Trott |
| 6,202,165 | B1 | 3/2001 | Pine |
| 6,477,285 | B1 | 11/2002 | Shanley |
| 7,251,386 | B1 | 7/2007 | Dickinson et al. |
| 7,310,459 | B1 | 12/2007 | Rahman |
| 7,894,699 | B2 | 2/2011 | Beausoleil |
| 8,450,186 | B2 | 5/2013 | Rong et al. |
| 9,671,572 | B2 | 6/2017 | Decker et al. |
| 9,922,887 | B2 | 3/2018 | Vermeulen et al. |
| 10,847,467 | B2 | 11/2020 | Collins et al. |
| 11,036,002 | B2 | 6/2021 | Harris et al. |
| 11,754,783 | B2 | 9/2023 | Harris et al. |
| 11,860,413 | B2 | 1/2024 | Harris et al. |
| 2002/0028045 | A1 | 3/2002 | Yoshimura et al. |
| 2004/0258408 | A1 | 12/2004 | Ramaswami et al. |
| 2005/0224946 | A1 | 10/2005 | Dutta |
| 2007/0280585 | A1 | 12/2007 | Warashina et al. |
| 2008/0044128 | A1 | 2/2008 | Kish, Jr. et al. |
| 2008/0089640 | A1 | 4/2008 | Beausoleil |
| 2009/0103345 | A1 | 4/2009 | Mclaren et al. |
| 2009/0103855 | A1 | 4/2009 | Binkert et al. |
| 2010/0054671 | A1 | 3/2010 | Ban et al. |
| 2011/0052120 | A1 | 3/2011 | Tan et al. |
| 2011/0073989 | A1 | 3/2011 | Rong et al. |
| 2011/0128790 | A1 | 6/2011 | Sarin et al. |
| 2011/0269456 | A1 | 11/2011 | Krishnaswamy et al. |
| 2012/0149148 | A1 | 6/2012 | Dallesasse et al. |
| 2012/0177381 | A1 | 7/2012 | Dobbelaere et al. |
| 2012/0203695 | A1 | 8/2012 | Morgan et al. |
| 2013/0051725 | A1 | 2/2013 | Shinoda et al. |
| 2013/0071121 | A1 | 3/2013 | Sharapov et al. |
| 2013/0156366 | A1 | 6/2013 | Raj et al. |
| 2013/0209112 | A1 | 8/2013 | Witzens |
| 2013/0243429 | A1 | 9/2013 | Whelihan et al. |
| 2013/0292840 | A1 | 11/2013 | Shoemaker et al. |
| 2013/0308893 | A1 | 11/2013 | Zuffada et al. |
| 2014/0040698 | A1 | 2/2014 | Loh et al. |
| 2014/0043050 | A1 | 2/2014 | Stone et al. |
| 2014/0264400 | A1 | 9/2014 | Lipson et al. |
| 2014/0268980 | A1 | 9/2014 | Kim et al. |
| 2014/0294342 | A1 | 10/2014 | Offrein et al. |
| 2014/0300008 | A1 | 10/2014 | Duan et al. |
| 2014/0363124 | A1 | 12/2014 | Pelley et al. |
| 2014/0363172 | A1 | 12/2014 | Pelley et al. |
| 2015/0381273 | A1 | 12/2015 | Gloeckner et al. |
| 2016/0085038 | A1 | 3/2016 | Decker et al. |
| 2016/0181322 | A1 | 6/2016 | Mazed et al. |
| 2016/0191188 | A1 | 6/2016 | Butler |
| 2016/0216445 | A1 | 7/2016 | Thacker et al. |
| 2016/0252688 | A1 | 9/2016 | Barwicz et al. |
| 2017/0108655 | A1 | 4/2017 | Zarbock et al. |
| 2017/0160474 | A1 | 6/2017 | Mahmoodian et al. |
| 2017/0194309 | A1 | 7/2017 | Evans et al. |
| 2018/0045885 | A1 | 2/2018 | Canali et al. |
| 2019/0162901 | A1 | 5/2019 | Yu et al. |
| 2019/0189603 | A1 | 6/2019 | Wang et al. |
| 2019/0310433 | A1 | 10/2019 | Yoo et al. |
| 2019/0335252 | A1 | 10/2019 | Ryan |
| 2019/0363797 | A1 | 11/2019 | Peterson et al. |
| 2020/0006304 | A1 | 1/2020 | Chang et al. |
| 2020/0111720 | A1 | 4/2020 | Wan et al. |
| 2020/0284981 | A1 | 9/2020 | Harris et al. |
| 2021/0096311 | A1 | 4/2021 | Yu et al. |
| 2021/0118853 | A1 | 4/2021 | Harris et al. |
| 2021/0202562 | A1 | 7/2021 | Chang et al. |
| 2021/0215897 | A1 | 7/2021 | Epitaux et al. |
| 2021/0242124 | A1 | 8/2021 | Kannan et al. |
| 2021/0278590 | A1 | 9/2021 | Harris et al. |
| 2021/0375829 | A1 | 12/2021 | Or-Bach et al. |
| 2022/0109075 | A1 | 4/2022 | Byrd et al. |
| 2022/0148627 | A1 | 5/2022 | Meade et al. |
| 2023/0085268 | A1 | 3/2023 | Harris et al. |
| 2023/0114842 | A1 | 4/2023 | Harris et al. |
| 2023/0114847 | A1 | 4/2023 | Harris et al. |
| 2023/0308188 | A1 | 9/2023 | Dorta-Quinones et al. |
| 2023/0314711 | A1 | 10/2023 | Eslampour et al. |
| 2023/0314742 | A1 | 10/2023 | Dorta-Quinones et al. |
| 2023/0358957 | A1 | 11/2023 | Harris et al. |
| 2023/0388024 | A1 | 11/2023 | Tymchenko et al. |
| 2023/0400632 | A1 | 12/2023 | Harris et al. |
| 2023/0408764 | A1 | 12/2023 | Harris et al. |

FOREIGN PATENT DOCUMENTS

| | | | | |
|---|---|---|---|---|
| JP | H07-98463 | A | | 4/1995 |
| JP | 2005-502127 | A | | 1/2005 |
| JP | 2011-501238 | A | | 1/2011 |
| JP | 2011-503760 | A | | 1/2011 |
| JP | 2015-062027 | A | | 4/2015 |
| JP | 2018-506072 | A | | 3/2018 |
| JP | 2018-093007 | A | | 6/2018 |
| JP | 2018195723 | A | * | 12/2018 |
| KR | 10-2010-0095515 | A | | 8/2010 |
| TW | 508834 | B | | 11/2002 |
| WO | WO 2011/143548 | A2 | | 11/2011 |
| WO | WO 2016/008771 | A1 | | 1/2016 |
| WO | WO-2018198490 | A1 | * | 11/2018 ............. G02B 6/136 |
| WO | WO 2019/132970 | A1 | | 7/2019 |

OTHER PUBLICATIONS

Akihiro, Machine Translation of WO 2018-198490 A1), Nov. 1, 2018. (Year: 2018).*
International Search Report and Written Opinion dated Feb. 28, 2024, in connection with International Application No. PCT/US2023/80883.
Extended European Search Report dated Feb. 19, 2024, in connection with European Application No. 21750009.9.
U.S. Appl. No. 18/356,680, filed Jul. 21, 2023, Harris et al.
U.S. Appl. No. 18/455,235, filed Aug. 24, 2023, Harris et al.
U.S. Appl. No. 18/455,395, filed Aug. 24, 2023, Harris et al.
U.S. Appl. No. 18/526,714, filed Dec. 1, 2023, Harris et al.
U.S. Appl. No. 18/526,652, filed Dec. 1, 2023, Harris et al.
U.S. Appl. No. 17/165,157, filed Feb. 2, 2021, Kannan et al.
U.S. Appl. No. 17/942,404, filed Sep. 12, 2022, Harris et al.
U.S. Appl. No. 17/964,337, filed Oct. 12, 2022, Harris et al.
U.S. Appl. No. 18/190,941, filed Mar. 27, 2023, Dorta-Quinones et al.
U.S. Appl. No. 18/190,926, filed Mar. 27, 2023, Eslampour et al.
U.S. Appl. No. 18/190,931, filed Mar. 27, 2023, Tymchenko et al.
U.S. Appl. No. 18/190,940, filed Mar. 27, 2023, Dorta-Quinones et al.
PCT/US2020/021209, May 1, 2020, Invitation to Pay Additional Fees.

(56) References Cited

OTHER PUBLICATIONS

PCT/US2020/021209, Jul. 6, 2020, International Search Report and Written Opinion.
PCT/US2019/029803, Nov. 26, 2020, International Preliminary Report on Patentability.
PCT/US2020/021209, Sep. 16, 2021, International Preliminary Report on Patentability.
PCT/US2021/016129, Aug. 18, 2022, International Preliminary Report on Patentability.
PCT/US2019/029803, Sep. 3, 2019, International Search Report and Written Opinion.
PCT/US2019/029803, Jun. 19, 2019, Invitation to Pay Additional Fees.
EP 19803311.0, Feb. 11, 2022, Extended European Search Report.
EP 20766814.6, Nov. 4, 2022, Extended European Search Report.
PCT/US2022/046379, Jan. 18, 2023, International Search Report and Written Opinion.
PCT/US2022/043209, Jan. 26, 2023, International Search Report and Written Opinion.
PCT/US2021/016129, Apr. 14, 2021, International Search Report and Written Opinion.
PCT/US2022/043209, Nov. 7, 2022, Invitation to Pay Additional Fees.
SG 11202114009, May 13, 2022, Singapore Search Report and Written Opinion.
PCT/US2023/065007, Aug. 25, 2023, Invitation to Pay Additional Fees.
JP 2021-514285, May 9, 2023, Japanese Office Action.
Extended European Search Report dated Feb. 11, 2022, in connection with European Application No. 19803311.0.
Extended European Search Report dated Nov. 4, 2022, in connection with European Application No. 20766814.6.
International Preliminary Report on Patentability for International Application No. PCT/US2019/029803 mailed Nov. 26, 2020.
International Preliminary Report on Patentability for International Application No. PCT/US2020/021209, mailed Jul. 6, 2020.
International Preliminary Report on Patentability mailed Aug. 18, 2022, in connection with International Application No. PCT/US2021/016129.
International Search Report and Written Opinion for International Application No. PCT/US2020/021209, mailed Jul. 6, 2020.
International Search Report and Written Opinion for International Application No. PCT/US2019/029803 mailed Sep. 3, 2019.
International Search Report and Written Opinion mailed Apr. 14, 2021, in connection with International Application No. PCT/US2021/016129.
International Search Report and Written Opinion mailed Jan. 18, 2023, in connection with International Application No. PCT/US2022/046379.
International Search Report and Written Opinion mailed Jan. 26, 2023, in connection with International Application No. PCT/US2022/043209.
Invitation to Pay Additional Fees dated Aug. 25, 2023, in connection with International Application No. PCT/US2023/065007.
Invitation to Pay Additional Fees for International Application No. PCT/US2020/021209, mailed May 1, 2020.
Invitation to Pay Additional Fees for International Application No. PCT/US2019/029803 mailed Jun. 19, 2019.
Invitation to Pay Additional Fees mailed Nov. 7, 2022, in connection with International Application No. PCT/US2022/043209.
Japanese Office Action dated May 9, 2023, in connection with Japanese Application No. 2021-514285.
Singapore Search Report and Written Opinion mailed May 13, 2022, in connection with Singapore Application No. 11202011400P.
Beausoleil et al., Nanoelectronic and nanophotonic interconnect. Proceedings of the IEEE. Feb. 2008;96(2):230-47. doi: 10.1109/JPROC.2007.911057.
Bell, Shane et al., TILE64—Processor: A 64-Core SoC with Mesh Interconnect, 2008 IEEE. International Solid-State Circuits Conference—Digest of Technical Papers, Feb. 2008, pp. 1-3, DOI:10.1109/ISSCC.2008.4523070.
Fujikata et al., LSI on-chip optical interconnection with Si nanophotonics. Extended Abstracts of the 2007 International Conference on Solid State Devices and Materials. 2007. pp. 276-277.
Grigalunas, Tell Me—What Is Wafer Dicing? Eastern States Components, LLC. Sep. 26, 2017. 2 pages. URL:https://www.escomponents.com/blog/2017/9/26/tell-me-what-is-wafer-dicing [retrieved Jul. 13, 2020].
Udipi et al., Combining memory and a controller with photonics through 3D-stacking to enable scalable and energy-efficient systems. 38th Annual International Symposium on Computer Architecture (ISCA). Jun. 8, 2011;425-436.
Wada, Electronics and Photonics Convergence on Si CMOS Platform. Proc. of SPIE. 2004;5357:16-24.
Young et al., Optical technology for energy efficient I/O in high performance computing. IEEE Communications Magazine. Oct. 2010;48:184-91.

* cited by examiner

PHOTONIC WAFER COMMUNICATION SYSTEMS AND RELATED PACKAGES

CROSS-REFERENCE TO RELATED APPLICATIONS

This application is a continuation claiming the benefit under 35 U.S.C. § 120 of U.S. patent application Ser. No. 17/165,157, titled "PHOTONIC WAFER COMMUNICATION SYSTEMS AND RELATED PACKAGES," filed Feb. 2, 2021, which claims the benefit under 35 U.S.C. § 119(c) to U.S. Provisional Patent Application Ser. No. 62/969,373, titled "PACKAGING AND POWER DISTRIBUTION OF LITHOGRAPHICALLY TILED PHOTONIC WAFER COMMUNICATION SYSTEMS," filed on Feb. 3, 2020, and U.S. Provisional Patent Application Ser. No. 63/087,052, titled "PACKAGING AND POWER DISTRIBUTION OF LITHOGRAPHICALLY TILED PHOTONIC WAFER COMMUNICATION SYSTEMS," filed on Oct. 2, 2020, each of which is hereby incorporated by reference herein in their entirety.

BACKGROUND

Conventional computation uses processors that include circuits and millions of transistors to implement logical gates on bits of information represented by electrical signals. The architectures of conventional central processing units (CPUs) are designed for general purpose computing but are not optimized for particular types of algorithms. Graphics processing, artificial intelligence, neural networks, and deep learning are a few examples of the types of algorithms that are computationally intensive and are not efficiently performed using a CPU. Consequently, specialized processors have been developed with architectures better-suited for particular algorithms. Graphical processing units (GPUs), for example, have a highly parallel architecture that makes them more efficient than CPUs for performing image processing and graphical manipulations. After their development for graphics processing, GPUs were also found to be more efficient than CPUs for other memory-intensive algorithms, such as neural networks and deep learning. This realization, and the increasing popularity of artificial intelligence and deep learning, lead to further research into new electrical circuit architectures that could further enhance the speed of these algorithms.

SUMMARY

Some embodiments relate to a photonic package comprising a substrate carrier having a recess formed therethrough; a photonic substrate disposed in the recess; a first electronic die disposed on top of the photonic substrate; and a power delivery substrate configured to convey electric power from the substrate carrier to the first electronic die.

In some embodiments, the power delivery substrate is configured to convey electric power from the substrate carrier to the first electronic die passing through the photonic substrate.

In some embodiments, the power delivery substrate rests in part on the substrate carrier and in part on the photonic substrate.

In some embodiments, the power delivery substrate is a first power delivery substrate, and wherein the photonic package further comprises a second power delivery substrate disposed on top of the first power delivery substrate.

In some embodiments, the power delivery substrate comprises a bridge die, and the bridge die comprises conductive traces configured to support propagation of the electric power, and the bridge die lacks transistors.

In some embodiments, the power delivery substrate comprises an interposer disposed between the photonic substrate and the first electronic die.

In some embodiments, the silicon interposer rests in part on the substrate carrier.

In some embodiments, the photonic package further comprises a material layer disposed in the recess between the substrate carrier and the photonic substrate.

In some embodiments, the photonic package further comprises a second electronic die, wherein the photonic substrate comprises first and second photonic modules, wherein the first electronic die is disposed on top of the first photonic module and the second electronic die is disposed on top of the second photonic module.

In some embodiments, the first and second photonic modules have at least one common layer pattern.

In some embodiments, the first electronic die is in contact with the photonic substrate.

In some embodiments, the photonic package further comprises a lid covering the photonic substrate, wherein the lid is in thermal contact with the first electronic die.

In some embodiments, the substrate carrier is made of ceramic.

Some embodiments relate to a photonic-electronic computing system comprising a substrate carrier; a photonic substrate disposed on the substrate carrier and patterned with first and second photonic modules monolithically embedded in the photonic substrate, wherein the first and second photonic modules share at least one common layer pattern; a first electronic die disposed on top of the first photonic module and a second electronic die disposed on top of the second photonic module; and a first power delivery substrate configured to convey electric power to the first electronic die.

In some embodiments, the first power delivery substrate is further configured to convey electric power to the second electronic die.

In some embodiments, the photonic-electronic computing system further comprises a second power delivery substrate configured to convey electric power to the second electronic die.

In some embodiments, the first power delivery substrate is configured to receive the electric power from the substrate carrier.

In some embodiments, the first photonic module is optically coupled to the second photonic module.

In some embodiments, the substrate carrier has a recess formed therethrough, wherein the first power delivery substrate rests in part on a first side of the substrate carrier and in part on a second side of the substrate carrier, wherein the first side and the second side are separated from one another by the recess.

In some embodiments, the first power delivery substrate comprises an opening, wherein the first electronic die is disposed in the opening.

In some embodiments, the first power delivery substrate has a plurality of openings formed therethrough such that the first bridge die comprises a plurality of columns and a plurality of rows of semiconductor material.

In some embodiments, the first power delivery substrate comprises conductive traces configured to support propagation of the electric power, and the first power delivery substrate lacks transistors.

In some embodiments, the first and second electronic dies are in contact with the photonic substrate.

Some embodiments relate to a method for manufacturing a photonic package comprising: placing an electronic die on a photonic substrate patterned with a plurality of photonic modules; forming a recess into a substrate carrier; placing the photonic substrate into the recess of the substate carrier; and placing a power delivery substrate in part on the photonic substrate and in part on the substrate carrier so that the power delivery substrate is in electrical communication with the electronic die.

In some embodiments, the method further comprises attaching a laser die to the photonic substrate.

In some embodiments, the method further comprises, prior to placing the photonic substrate into the recess of the substate carrier, placing a material layer on a surface of the photonic substrate so that, upon placing the photonic substrate into the recess, the material layer is between the photonic substrate and the substrate carrier.

In some embodiments, the method further comprises covering the electronic die with a lid so that the lid is in thermal contact with the electronic die.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

I. Overview

Figure 1A:
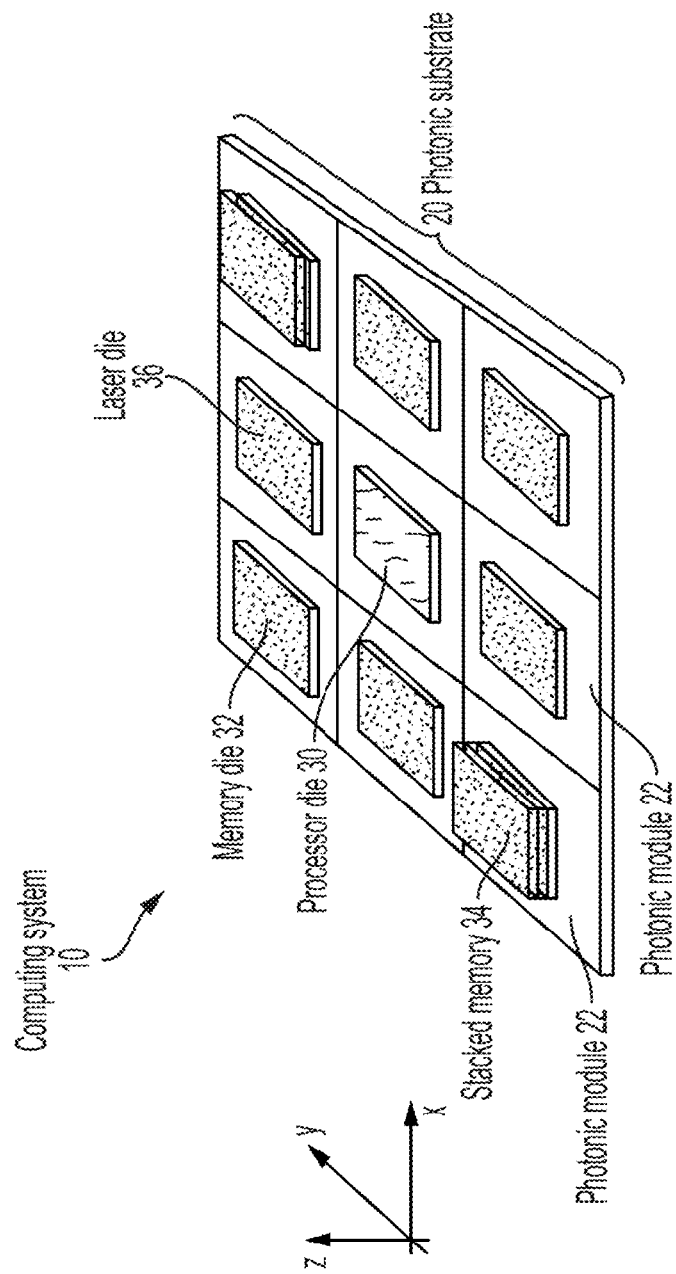
FIG. 1A is a schematic diagram of a computing system formed on a photonic substrate, in accordance with some embodiments.

The inventors have recognized and appreciated that one of the major bottlenecks limiting the spread of data-intensive computing is the inability to scale memory capacity and bandwidth in modern computers at sufficiently high rates. Conventional electronic computers rely on conductive traces to deliver data among their various components. Unfortunately, conductive traces are characterized by large parasitic impedance, especially at the frequencies necessary to produce high data rates. The parasitic impedance limits bandwidth scalability in two ways. First, it limits the bandwidth that a trace can support. Second, it increases power consumption. To make things worse, parasitic impedance increases with the length of a trace, meaning that the larger the separation between a memory chip and a processor, the lower the bandwidth. This is why conventional computing systems are typically designed so that memory chips are positioned within a few centimeters of the processor. However, there are only so many memory chips that can be accommodated within this range. The result is that conventional computing systems are limited in both memory bandwidth and memory capacity.

The inventors have developed communication platforms that enable scaling of memory capacity and bandwidth well beyond what is possible with conventional electronic computers. The communication platforms described herein overcome these limitations using optics. The physics according to which light propagates inside a waveguide makes optical communications inherently immune to parasitic impedance. The immunity to parasitic impedance leads to a major benefit—it removes the requirement that memory chips be positioned within a certain range of the processor.

The platforms described herein use "photonic substrates" for the distribution of data between different parts of a computing systems. Photonic substrates of the types include substrates (e.g., made of a semiconductor material such as silicon) lithographically patterned to have multiple photonic modules. As a result, the photonic modules are monolithically embedded in the photonic substrate. In some embodiment, each photonic module is patterned as a reticle shot of a step-and-repeat semiconductor manufacturing process. Accordingly, in some embodiments, the photonic modules are identical to one another (or have at least one common layer pattern, such as a common waveguide layer pattern).

The photonic modules are arranged side-by-side, for example, in a grid-like configuration. Each node of the grid may be occupied by a photonic module. Depending on the particular architecture to be implemented, at each node of the grid (or at least at some of the nides), there may an electronic die, such as a memory die or a processor die. Each photonic module includes programmable photonic circuits that can be configured based on the needs of a particular computer architecture. Some platforms are arranged according to 1-dimensional schemes, such as in blocks of 3×1 modules, in blocks of 5×1 modules, in blocks of 10×1 modules, 20×1 modules, etc. Some platforms are arranged according to 2-dimensional schemes, such as in blocks of 3×3 modules, in blocks of 5×3 modules, in blocks of 5×5 modules, in blocks of 10×10 modules, etc. The larger the size of the grid, the more sophisticated the computing architecture that be may achieved using these platforms. In one example, a 7×7 photonic substrate is provided having a total size equal to 182 mm×231 mm, where each photonic module is 26 mm×33 mm in size.

The inventors have appreciated a challenge stemming from the large size of these photonic substrates: it is difficult to deliver electric power uniformly across the entire extension of the substrate. Nodes that are closer to the edge of the photonic substrate generally receive high power. However, nodes that are closer to the middle of the photonic substate (and farther away from the edge) receive less power. This can be obviated by increasing the overall power delivered to the substrate. The drawback, however, is that doing so leads to spots of large temperature, and as a result, to localized variations in refractive index, which alter the functionality of the optical network in an unpredictable fashion.

The inventors have developed architectures for improving the uniformity with which electric power is delivered throughout a photonic substrate and the computing system that relies on it. These architectures rely on power delivery substrates (examples of which are described in detail further below) to convey power from the substrate carrier to the photonic modules and to the electronic dies. The power delivery substrates described herein deliver power not only to the periphery of the system, but also directly to the center. These substates can include bridge dies and/or interposers, and can be made by short looping wafer processing (which make them low cost). Short looping may involve processing a wafer with a reduced mask set (e.g., by skipping process steps associated with subsequent masks). This makes the cost per unit area very low, and opens the opportunity to deploy very large power substrates. The large area of the power substrate enables arbitrary power delivery networks, and thus, promotes uniform power distribution.

II. Photonic Substrates

Photonic substrates of the types described herein are designed to provide the fabric necessary to implement computing systems with arbitrary architectures. These photonics substrates may be arranged to form grids, where the nodes of the grid are occupied by photonic modules. Each photonic module communicates optically with the other photonic modules. Additionally, each photonic module interfaces with a respective electronic die, whether a memory die, a processor die, or other types of dies.

FIG. 1 illustrates an example computing system based on a photonic communication platform with nine photonic modules arranged in a 3×3 grid, in accordance with one example. Eat each node of the grid, photonic substrate 20 is patterned with a photonic module 22. This photonic communication platform supports one processor die (30) positioned in the middle of photonic substrate 20, and seven memory nodes surrounding the processor die. Some of the memory nodes include a single memory chip (see for example memory die 32). Other memory nodes include a stacked memory including multiple vertically-stacked memory dies (see for example stacked memory 34). A laser die 36 is mounted on top of one of the photonic modules. The dies can communicate with the photonic module electronically (e.g., using through-silicon vias, copper pillars, micro-bumps, ball-grid arrays or other electrical interconnects) and/or optically (e.g., using grating couplers, prisms, lenses or other optical couplers).

As described in detail further below, the photonic modules are patterned with optical waveguides and optical distribution networks. The optical distribution network of a photonic module can selectively place the die of that particular photonic module in optical communication with any other die of the computing system. For example, the optical distribution network of the photonic module positioned under processor die 30 may be reconfigured depending on the needs of the processor. At the beginning of a routine, the processor may need to access data stored in a first memory node. This read operation involves configuring the respective optical distribution networks to place the processor in optical communication with the first memory node. Later in the routine, the processor may need to write data into a second memory node. This write operation involves reconfiguring the optical distribution networks to place the processor in optical communication with the second memory node.

The photonic modules of photonic substrate 20 may be fabricated using a common photomask set (or at least one common photomask). This approach reduces costs in two ways. First, it reduces additional costs that would otherwise be incurred in procuring several different photomask sets. Second, it enables fabrication of photonic modules using standard semiconductor foundries, some of which require that the same photomask set (or at least one photomask) be used across an entire wafer. Designing photonic modules that share at least one photomask enables fabrication of many photonic modules on the same semiconductor wafer while leveraging standard, low-cost step-and-repeat manufacturing processes.

Figure 1B:
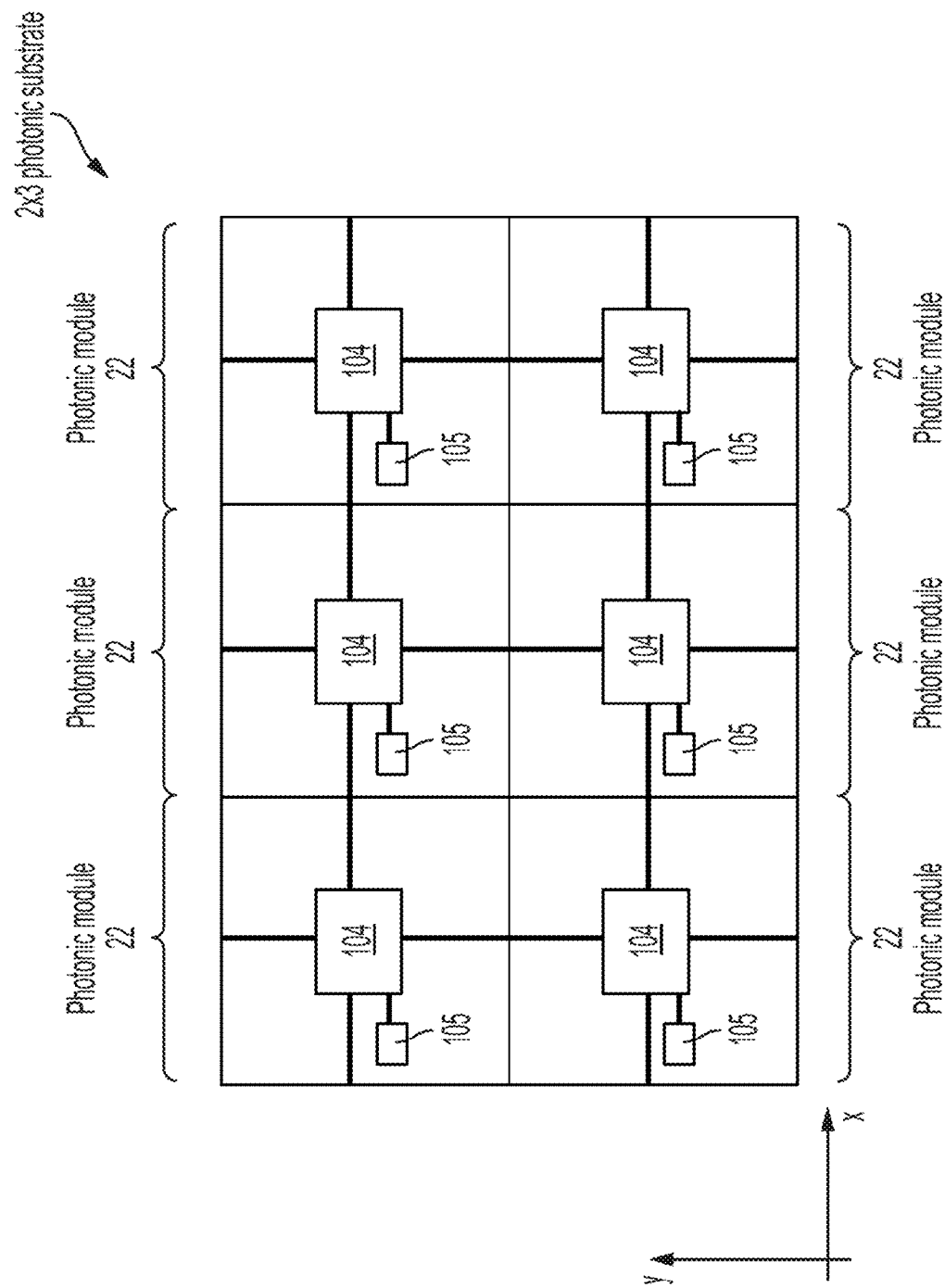
FIG. 1B is a schematic diagram of a representative photonic substrate including a plurality of photonic modules, in accordance with some embodiments.
Figure 1C:
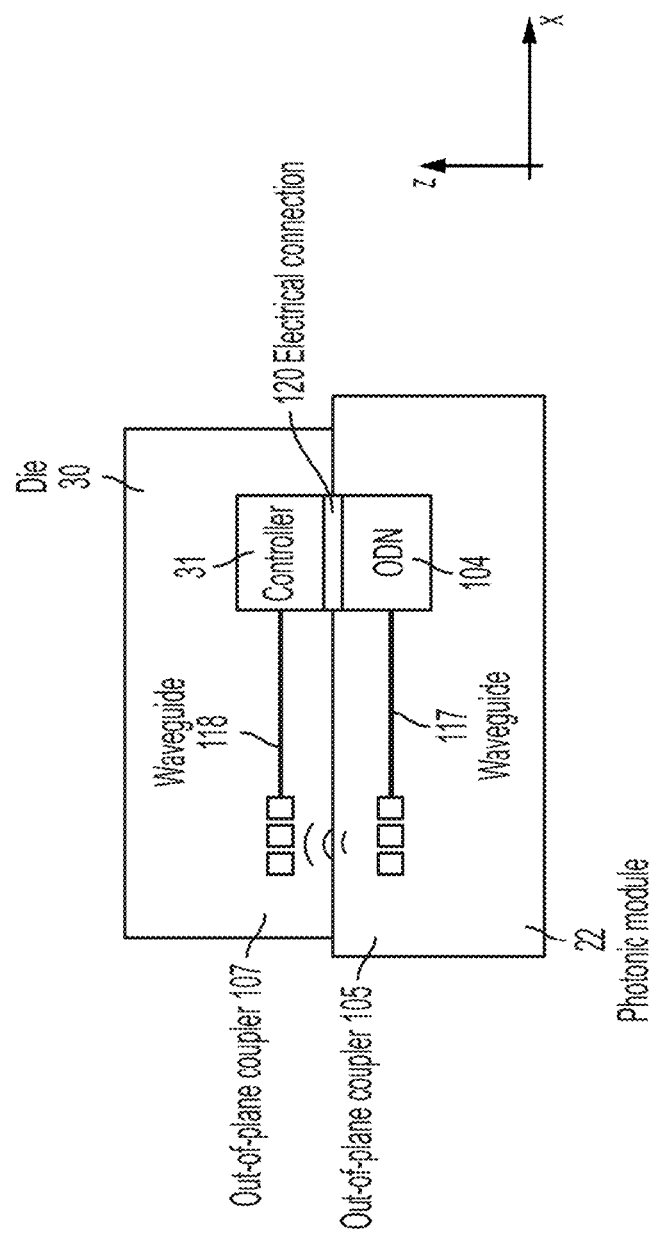
FIG. 1C is a cross sectional side view of an electronic die mounted on a photonic module, in accordance with some embodiments.

FIG. 1B illustrates an example 2×3 photonic substrate including six photonic modules 22. In this example, all the photonic modules are patterned according to the same template. In some embodiments, however, only a sub-set of the layers of the photonic modules are patterned according to the same template. For instance, the layer in which optical waveguides are defined is patterned with the same template six times, while another layer (e.g., a metal layer) does not follow a periodic arrangement. The photonic modules 22 are arranged so that waveguide 111 of an optical module is aligned with waveguide 112 of the optical module to the left of that optical module, waveguide 112 of an optical module is aligned with waveguide 111 of the optical module to the right of that optical module, waveguide 113 of an optical module is aligned with waveguide 114 of the optical module above that optical module and waveguide 114 of an optical module is aligned with waveguide 113 of the optical module below that optical module. As a result, the optical modules form an optical network.

Optical distribution networks 104 may be reconfigurable. Therefore, optical distribution networks 104 may route optical signals anywhere inside or outside the network. Suppose, for example, that a processor is mounted to the photonic module positioned at the north-west corner of the photonic substrate and that a memory is mounted to the photonic module positioned at the south-east corner of the photonic substrate. A read operation may involve reconfiguring the optical distribution networks to place the processor in optical communication with the memory. For example, an optical communication path may be formed that 1) couples the processor to the out-of-plane coupler of the photonic module to which the processor is mounted, 2) couples the out-of-plane coupler of that photonic module to waveguide 112 of the same photonic module, 3) couples waveguide 112 of that photonic module to waveguide 111 of the adjacent photonic module (mid-uppermost photonic module), 4) couples waveguide 112 of the mid-uppermost photonic module to waveguide 111 of the next adjacent photonic module (north-east corner of the photonic substrate), 5) couples waveguide 114 of the photonic module positioned at north-cast corner to waveguide 113 of the photonic module to which the memory is mounted, and 6) couples waveguide 113 of the photonic module to which the memory is mounted to the out-of-plane coupler of the same photonic module.

As illustrated in FIG. 1A, an electronic die may be mounted on each (or at least some) photonic module. The manner in which an electronic die may be mounted on a photonic module is depicted in additional detail in FIG. 1C. In this cross sectional side view, an electric die 30 is mounted on a photonic module 22. Electronic die 30 communicates with photonic module 22 either electrically (by way of electrical connection 120) or optical (by way of out-of-plane optical couplers 105 and 107), or both. For clarity, only out-of-plane coupler 105, waveguide 117 and optical distribution network (ODN) 104 are illustrated inside optical module 22. Die 30 includes a waveguide 118 placing controller 31 in optical communication with out-of-plane coupler 107. Controller 31 is electrically coupled to optical distribution network 104 via electrical connection 120, which may include for example a ball-grid array, copper pillars, through silicon vias, micro-bumps, metals pads, etc. Controller 31 controls the operations of optical distribution network 104. For example, controller 31 controls the direction of routing of optical distribution network 104. Control signals are provided to optical distribution network 104 via electrical connection 120.

III. Photonic Packages

The inventors have appreciated that it is challenging to distribute power uniformly across a computing system of the type described herein. Consider for example the computing system of FIG. 1A. In this case, it is relatively easy to deliver power to the eight dies positioned at the periphery of the photonic substrate. However, due to its location away from the periphery, it is more challenging to deliver power to processor die 30.

Figure 2A:
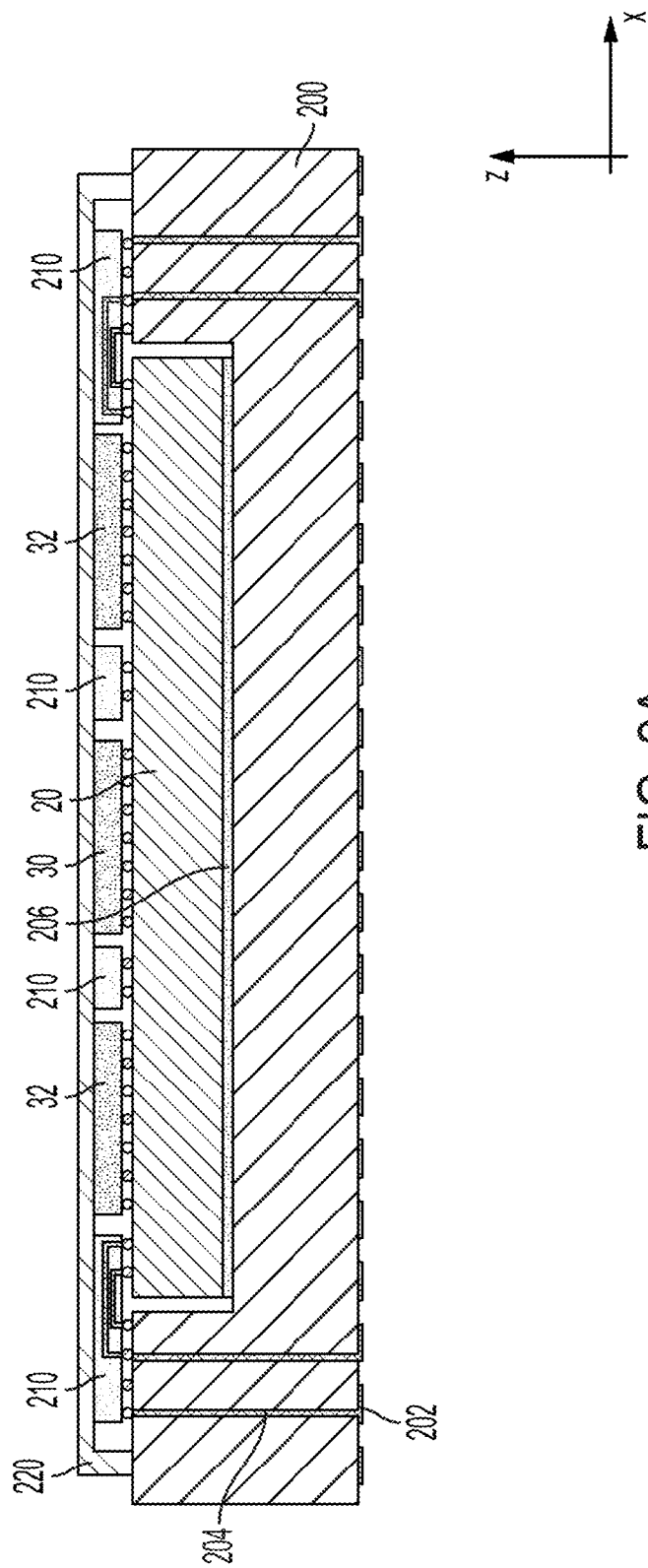
FIG. 2A is a cross sectional side view of a photonic package, in accordance with some embodiments.

Recognizing this problem, the inventors have developed power delivery architectures and packages that allow for more uniform power distribution. In some embodiment, these architectures rely on power delivery substrates to deliver power not only to the dies positioned at the periphery of a photonic substrate, but also directly to the dies positioned away from the periphery. One such package is illustrated in FIG. 2A. The package of FIG. 2A includes a substrate carrier 200, a photonic substrate 20, electronic dies 30 and 32, power delivery substrates 210 and lid 220. Photonic substrate 20 and the electronic dies that are mounted on it have been described in detail above.

Figure 2B:
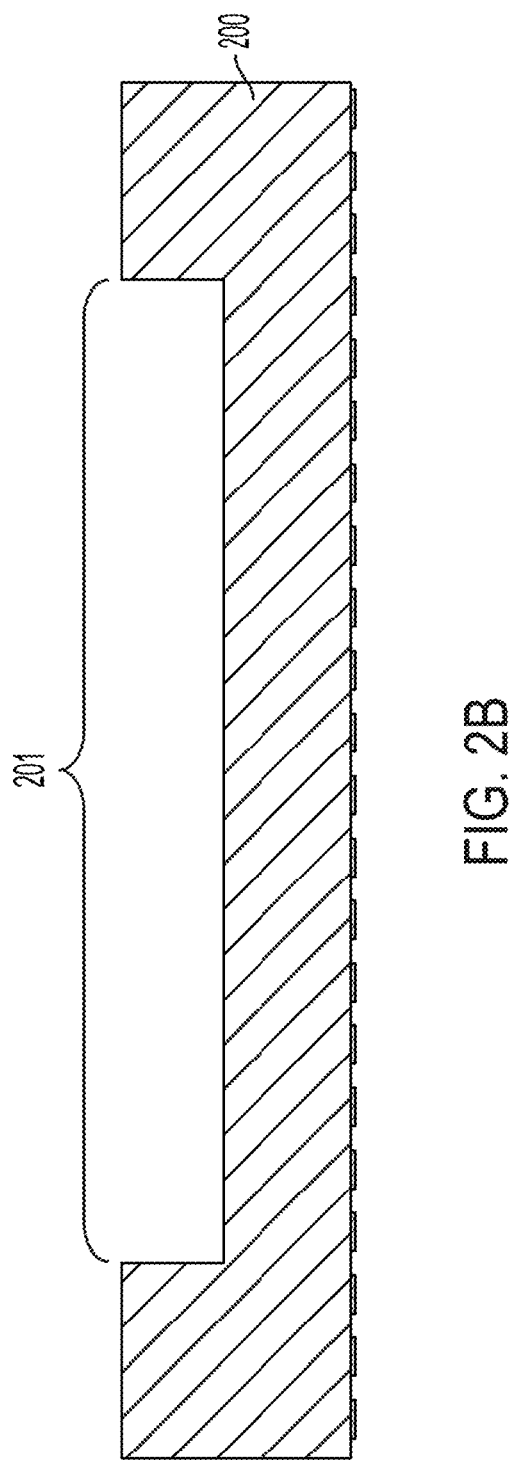
FIG. 2B is a cross sectional side view illustrating the substrate carrier of the photonic package of FIG. 2A, in accordance with some embodiments.

Substrate carrier 200 is illustrated on its own in FIG. 2B. As shown in this figure, substrate carrier 200 includes a recess 201 formed through a portion of the substrate carrier's top surface. Referring back to FIG. 2A, photonic substrate 20 is disposed inside recess 201. In some embodiments, substrate carrier 200 is made of a material having a coefficient of thermal expansion that is close to the coefficient of thermal expansion of photonic substrate 20. For example, photonic substrate 20 may be made of silicon and substrate carrier 200 may be made of ceramic (including a ceramic laminate). In another example, photonic substrate 20 may be made of silicon and substrate carrier 200 may be made of a material having a coefficient of thermal expansion between 0.5 ppm/° C. and 30 ppm/0° C., between 0.5 ppm/0° C. and 20 ppm/° C., between 0.5 ppm/0° C. and 10 ppm/C or between 0.5 ppm/0° C. and 5 ppm/° C., among other possible ranges. The inventors have appreciated that having materials with similar thermal expansion reduce substrate warping that may otherwise occur during a thermal reflow. In some embodiments, a material layer 206 is disposed between the bottom surface of recess 201 and the bottom surface of photonic substrate 20. In some embodiments, substrate carrier 200 may be made of a ceramic laminate. Since ceramic laminates are formed using a co-firing process, shrinkage may result, and the position of the contacts may vary. To mitigate this effect, in some embodiments, material layer 206 is disposed on top of the ceramic laminate after co-firing using a standard lithography process. As the substrate carrier is in thermal contact with the photonic substrate (and the electronic dies through metallic lines), the substrate carrier can be used as a thermal sink (or source) to remove heat from the package or maintain a certain temperature of the package.

Substrate carrier 200 includes conductive pads 202. When the carrier substrate is mounted on a printed circuit board, conductive pads 202 places the carrier substrate in electrical communication with the printed circuit board.

As described in connection with FIG. 1A, memory dies 32 and processor die 30 are mounted on respective photonic modules of photonic substrate 20. Lid 220 covers the electronic dies and is placed in thermal contact with the electronic dies (either by direct contact or by way of a thermal material such as a thermal paste). Accordingly, lid 220 transfers heat generated by the dies outside the package.

Figure 2C:
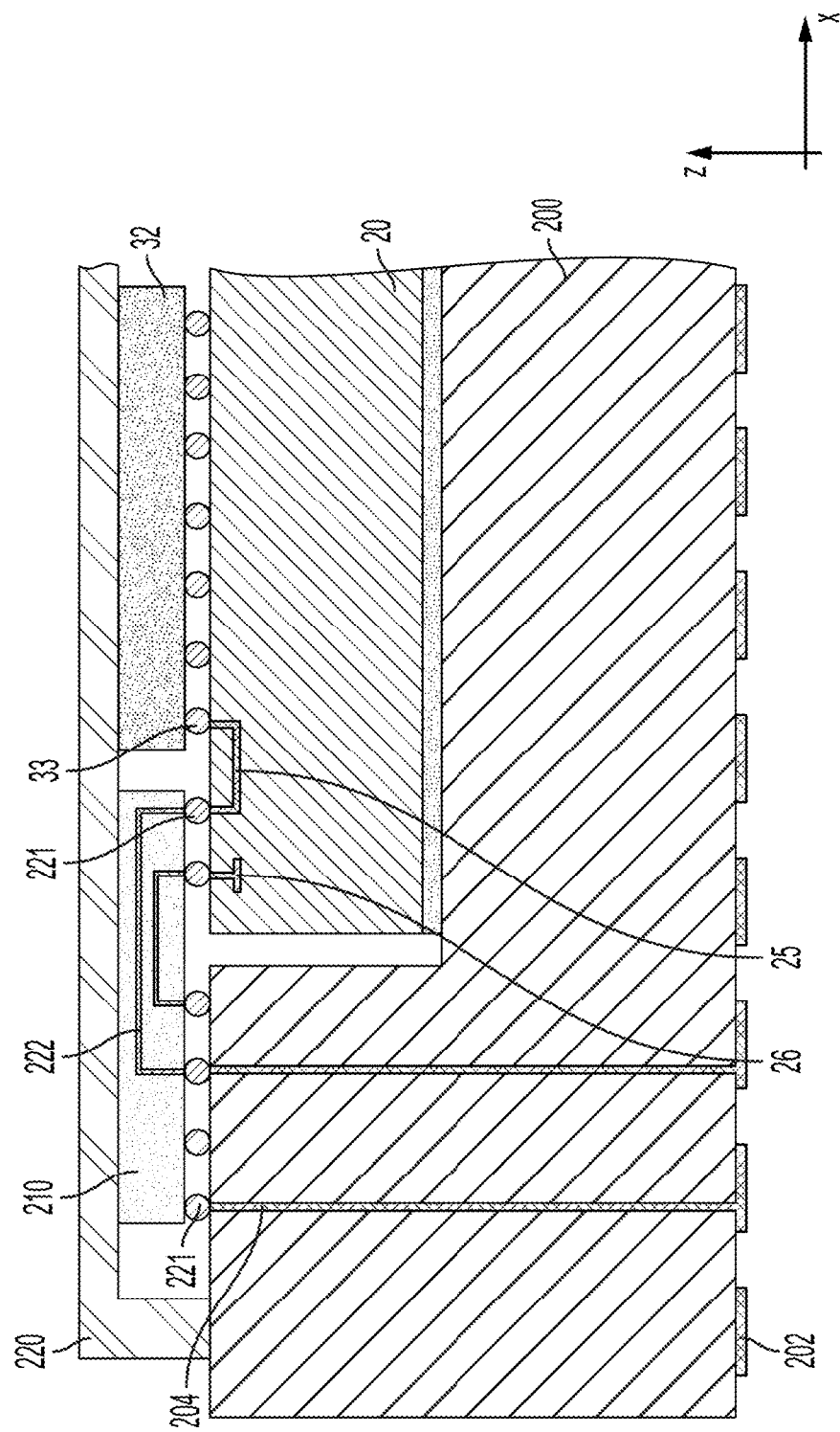
FIG. 2C is a cross sectional side view illustrating a portion of the photonic package of FIG. 2A in additional detail, in accordance with some embodiments.

The package of FIG. 2A relies on power delivery substates 210 to convey power to the dies and to the photonic substrate. One such power delivery substrate is illustrated in FIG. 2C in additional detail. In some embodiments, a power delivery substate 210 is disposed in part on the substrate carrier and in part on the photonic substrate. In these embodiments, the height of the recess may substantially match the height of the photonic substrate (or may substantially match the height of the photonic substrate plus the height of material layer 206). Power delivery substrates 210 may be implemented using any suitable technology. In one example, a power delivery substrate is a bridge die (e.g., made of silicon) including metal traces 222. The metal traces may be patterned to place various connections 221 (which may include, among others, copper pillars, micro-bumps, ball-grid arrays or other electrical interconnects) in mutual communication. In some embodiments, a bridge die may be fabricated using a relatively low-cost manufacturing process. In one example, a bridge die may be made with a relatively large fabrication node. In another example, a bridge die is fabricated using a small fabrication node, but is taken out of the fabrication process line before transistors may be fabricated on it. Accordingly, in some embodiments, a bridge die lacks transistors.

Substrate carrier 200 includes connections 204 (e.g., vias and/or conductive traces) placing pads 202 in communication with power delivery substrate 210 (through connections 221). Photonic substrate 20 includes connections 25 (e.g., vias and/or conductive traces) placing power delivery substrate 210 in communication with electronic die 32 (through respective connections 221 and 33). Photonic substrate 20 further includes connections 26 placing power delivery substrate 210 in communication with one or more photonic modules.

Figure 2D:
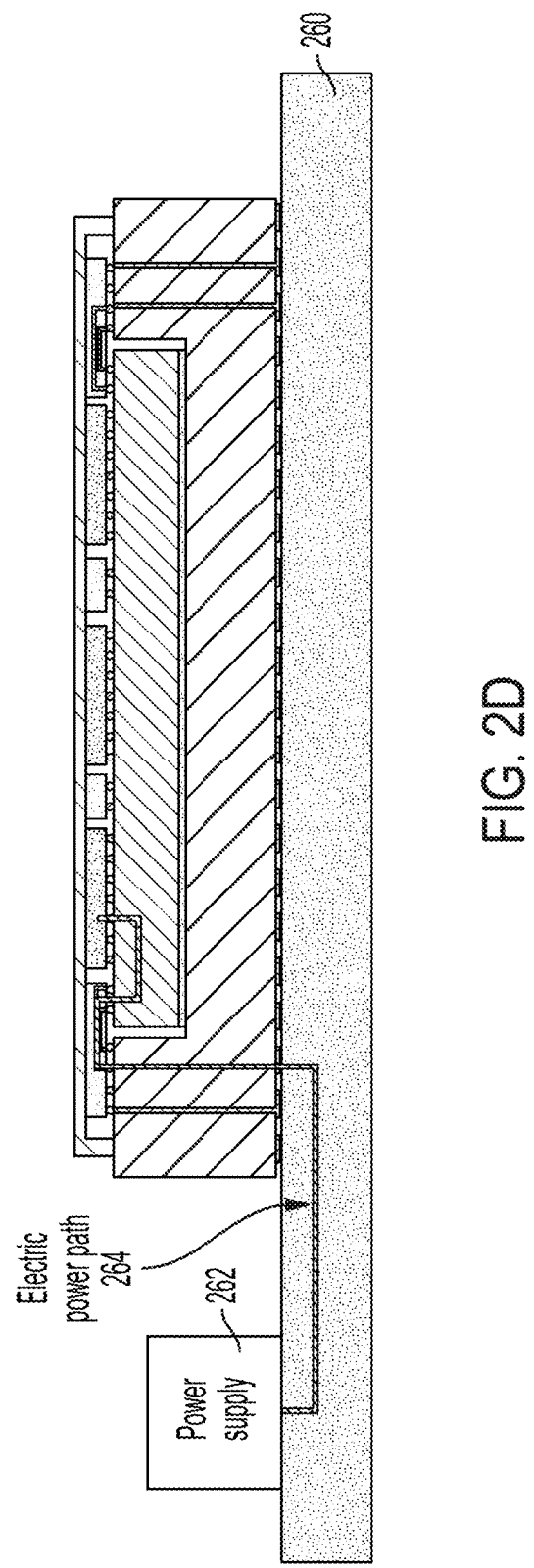
FIG. 2D is a cross sectional side view of a photonic package mounted on a printed circuit board, in accordance with some embodiments.

FIG. 2D illustrates how electric power may be delivered to the electronic dies, in accordance with some embodiments. In this example, substrate carrier 200 is mounted on a printed circuit board 260. A power supply 262 is also mounted on printed circuit board 260. An electrical power path 264 is formed from power supply 262 to electronic die 32. The electrical power path passes through printed circuit board 260, pad 202, connection 204, connection 221, traces 222, connection 25 and connection 33. In this respect, power delivery substrate 210 may be viewed as conveying power from substrate carrier 200 to electronic die 32 and to photonic substate 20.

Figure 2E:
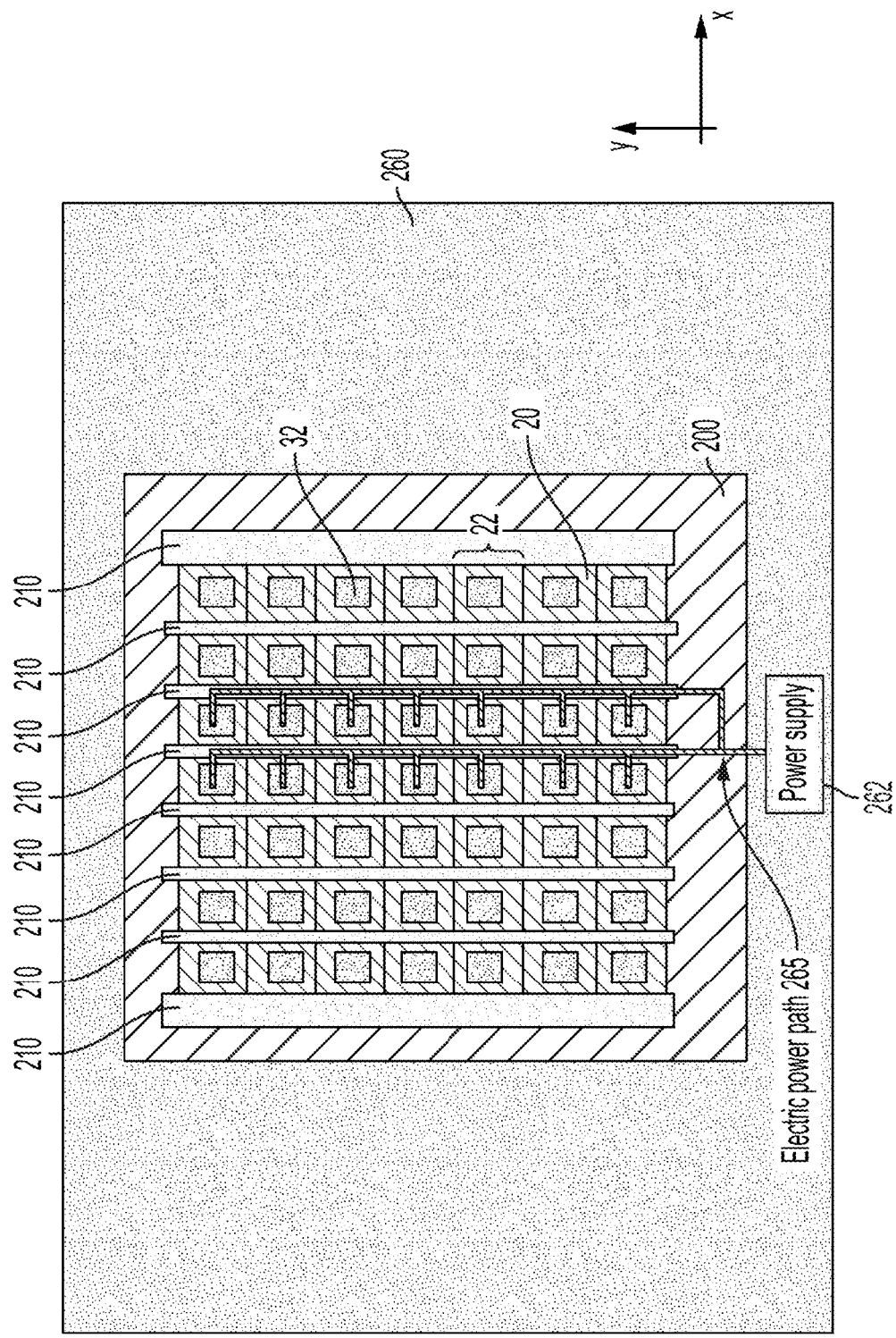
FIG. 2E is a top view of a photonic-electronic computing system, in accordance with some embodiments.

In some embodiments, a power delivery substrate conveys power to one electronic die. In other embodiments, a power delivery substrate conveys power to multiple electronic dies. One such embodiment is illustrated in FIG. 2E. In this example, a photonic-electronic computing system is formed that includes forty-nine dies disposed on a photonic substrate 20 having 7×7 photonic modules 22. Additionally, the photonic-electronic computing system includes eight power delivery substrates 210 disposed in parallel to one another. Each power delivery substrate 210 has an elongated shape (along the y-axis) in this example. Further, the power delivery substrates 210 rest on photonic substrate 20 and on two portions of the substrate carrier 200 that are on opposite sides of recess 201. In FIG. 2E, two power delivery substrates 210 are shown as conveying power to respective columns of electronic dies via electric power path 265. The other power delivery substrates 210 may convey power to the other die columns in a similar manner.

As discussed above, in some embodiments, bridge dies may serve as power delivery substrates. Bridge dies may be obtained by lithographically patterning a silicon wafer with conductive traces and vias and by dicing the wafer to form desired die shapes. In some embodiments, bridge dies lack transistors, though not all embodiments are limited in this respect. Other types of power delivery substrates are also possible. Interposers are another example.

Figure 3A:
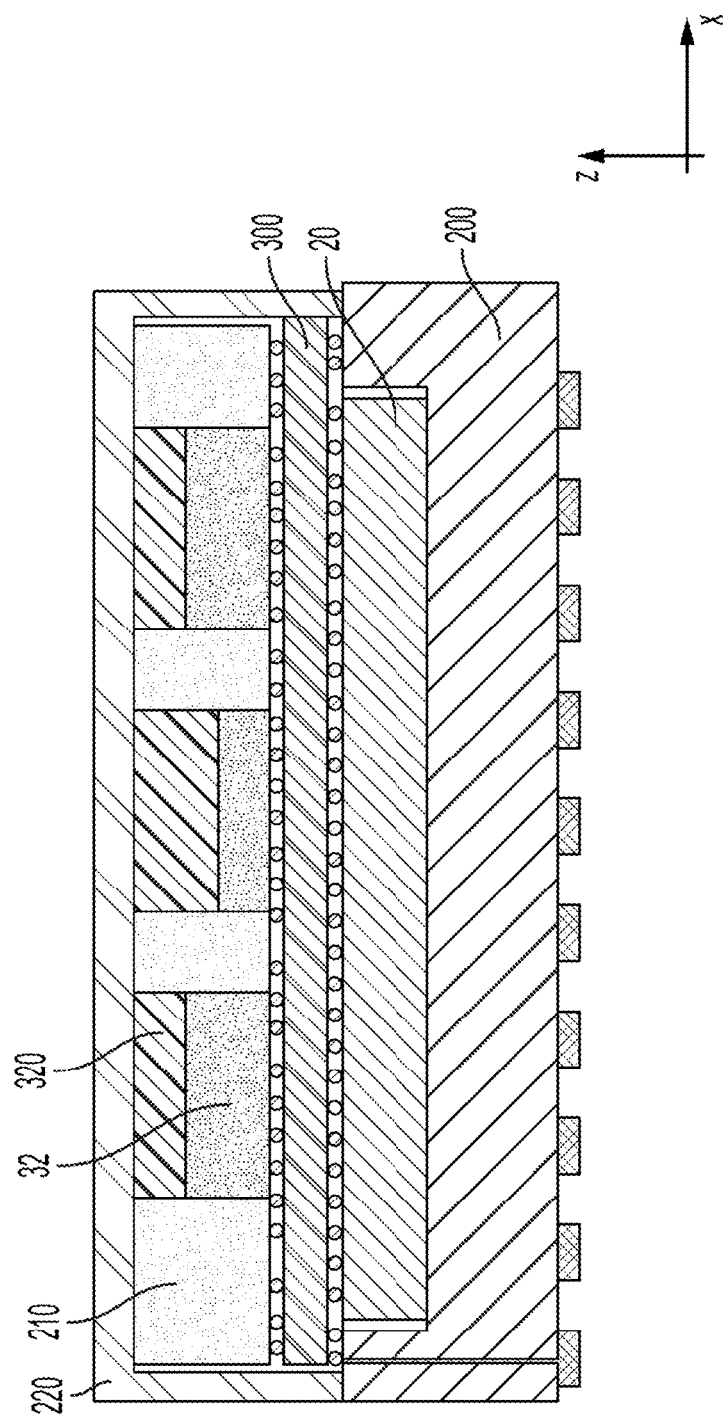
FIG. 3A is a cross sectional side view of another photonic package, in accordance with some embodiments.

FIG. 3A illustrates a photonic package including an interposer serving as a power delivery substrate, in accordance with some embodiments. Similar to the arrangement of FIG. 2A, the arrangement of FIG. 3A includes a substrate carrier 200 having a recess, a photonic substrate 20 disposed in the recess, electronic dies 30 and 32, multiple power delivery substrates 210 and a lid 220. In this example, power delivery substates 210 are implemented using bridge dies. The arrangement of FIG. 3A further includes power delivery substrate 300, which is implemented using an interposer. The interposer may be made, for example, of silicon or an organic material. In some embodiments, an interposer may be used to redistribute the heat within, and among, the electrical dies and the photonic substrate.

The interposer rests in part on photonic substrate 20, in part on a first portion of substrate carrier 200 and in part on a second portion of the substrate carrier, where the first and second portions are separated by recess 201. It should be appreciated that, in some embodiments, there may be multiple interposers (arranged for example in parallel columns, in a manner similar to the power delivery substrates of FIG. 2E). The interposer may distribute signals among the electronic dies, and between the electronic dies and the photonic substrate. For example, the interposer may spread the connections to a wider pitch than it would be possible if the electronic dies were connected directly to the photonic substrate. The benefit of an interposer is that it removes the need for the electronic dies to have the same pin out arrangement as in the photonic substrate. The electronic dies 30 and 32 and the power delivery substrates 210 rest on the interposer in this example. It should be noted that the electronic dies may have different heights. This may be the case, for example, if some of the electronic die include a stack of chips (e.g., a 3D-stacked memory unit). Thermal materials 320 of different heights may be placed on top of the electronic dies to ensure thermal contact with lid 220 regardless of the heights of the electronic dies. Thermal materials may help remove heat and/or maintain a certain temperature of the electronic dies and the photonic substrate.

Figure 3B:
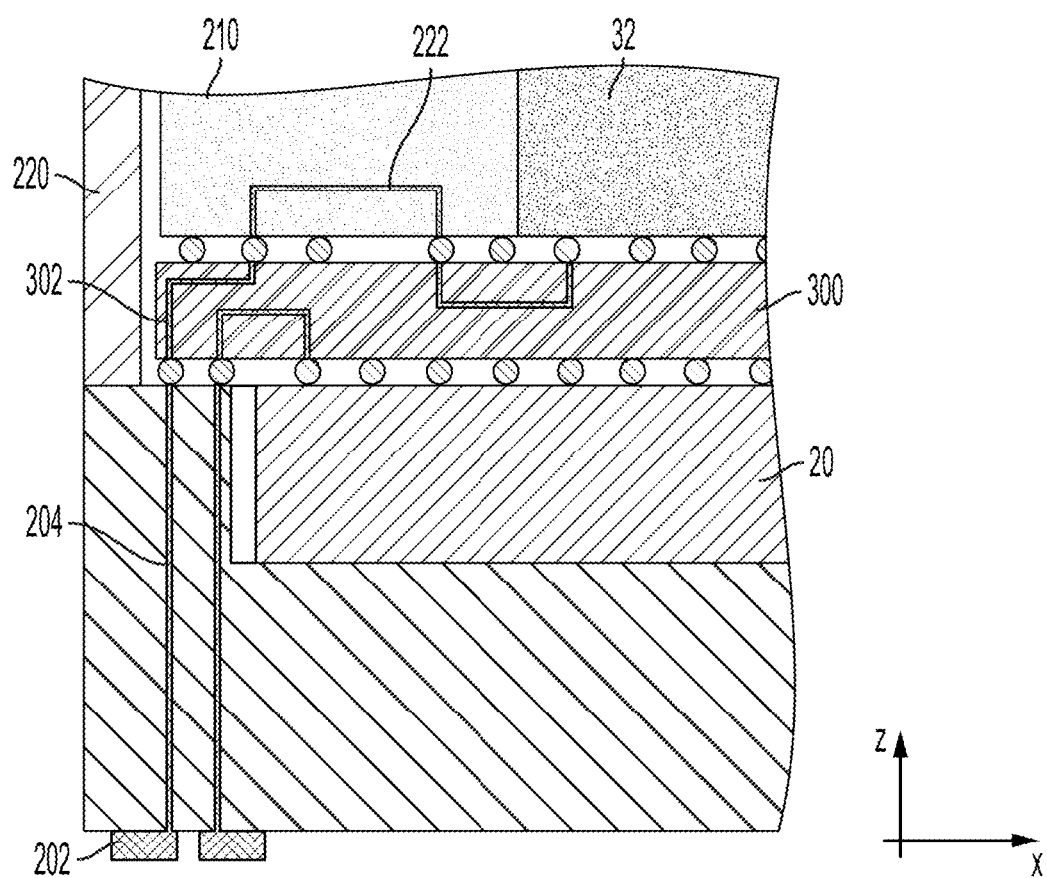
FIG. 3B is a cross sectional side view illustrating a portion of the photonic package of FIG. 3A in additional detail, in accordance with some embodiments.

In some embodiments, power delivery substrate 300 conveys power to an electronic die through a power delivery substrate 210. Additionally, or alternatively, power delivery substrate 300 may convey power to an electronic die directly. FIG. 3B illustrates a portion of the package of FIG. 3A in additional detail. As shown in this figure, power delivery substrate 300 includes vias and metal layers 302 for routing electric power and signals across the various components of the photonic package. Power delivery substrate 300 receives electric power from connections 204 and delivers some of that power to power delivery substrate 210 and some of that power to photonic substrate 20. Power delivery substrate 210, in turn, conveys power to electronic die 32 via metal trace 222. In other embodiments (not shown in FIG. 3B), power delivery substrate 300 conveys power directly to electronic die 32 without having to pass through a power delivery substrate 210.

Figure 3C:
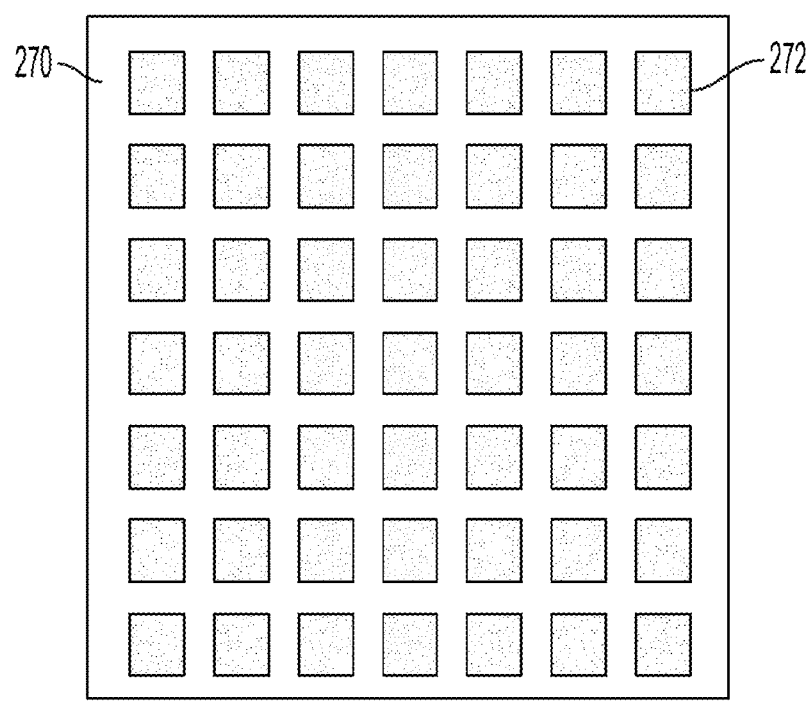
FIG. 3C is a top view illustrating a bridge die arranged with a plurality of rows and a plurality of columns, in accordance with some embodiments.
Figure 3D:
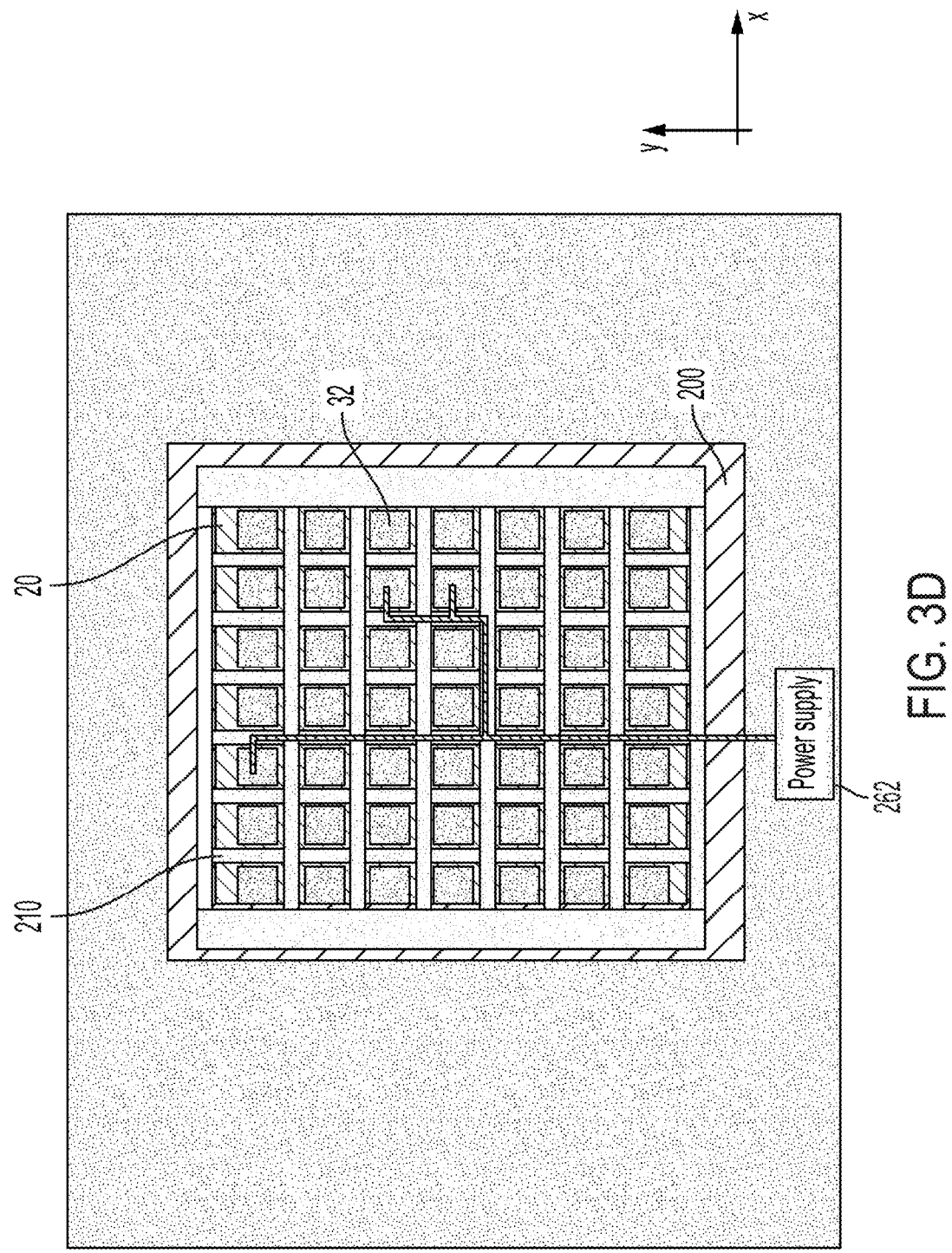
FIG. 3D is a top view of another photonic-electronic computing system, in accordance with some embodiments.

In some embodiments, a power delivery substrate may include a bridge die having a plurality of openings formed therethrough. For instance, one such power delivery substrate may be shaped to include multiple rows and columns of semiconductor material separated from each other by openings. FIG. 3C illustrates a bridge die 270 having multiple openings 272, where each opening is surrounded by semiconductor material. In this example, there are forty-nine openings disposed in a 7×7 configuration. This type of bridge die may be used in some embodiments to enable arbitrary power distribution networks. One example is shown in FIG. 3D. Here, each electronic die is disposed in a respective opening of the bridge die, either on an interposer (as in FIG. 3A) or directly on the photonic substrate (as in FIG. 2A). This arrangement allows the bridge die to distribute power to the electronic dies using arbitrary electric power paths. Such paths may be hard-wired or may be electronically reconfigurable.

Although the example of FIG. 3D illustrates a bridge die shaped with openings, additionally (or alternatively) an interposer may be shaped with openings such that electronic dies may be disposed in the openings. Additionally, in some embodiments, a photonic package may include multiple interposers of the type illustrated in FIG. 3A. Each interposer may interface a portion of the photonic substrate to a respective subset of the electronic dies.

Figure 4:
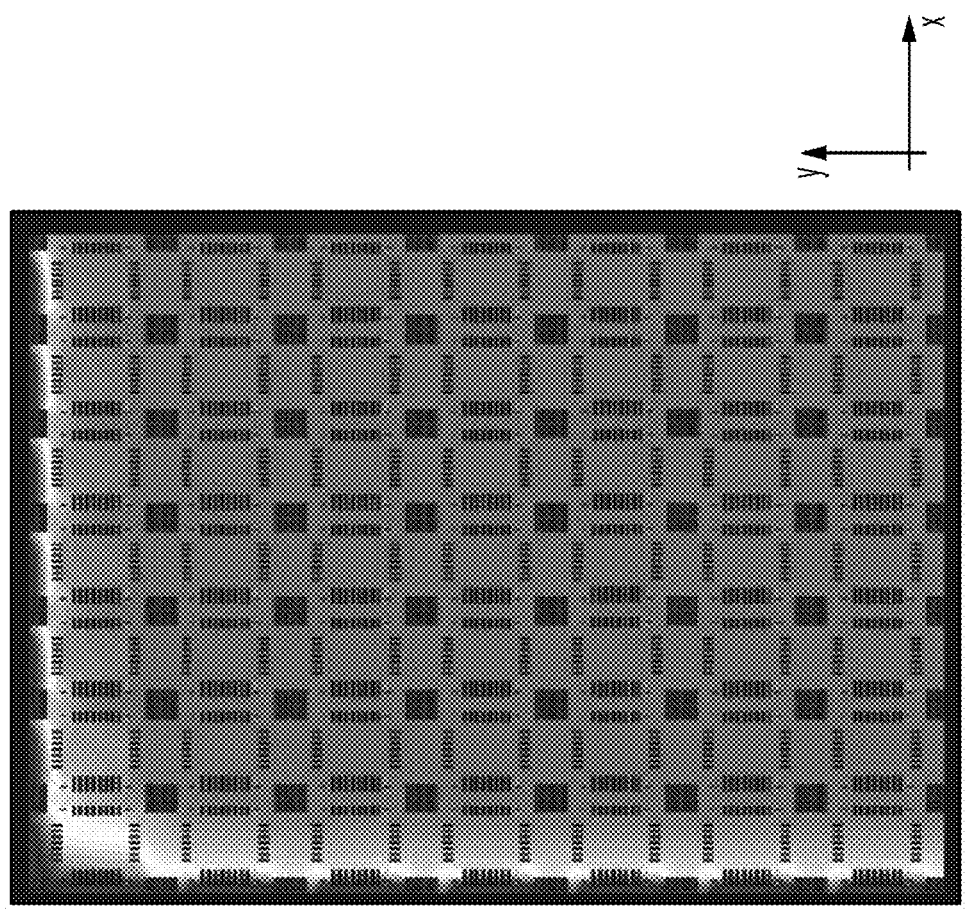
FIG. 4 is a heat chart illustrating the electric power distribution delivered across a representative photonic-electronic computing system, in accordance with some embodiments.
Figure 4:
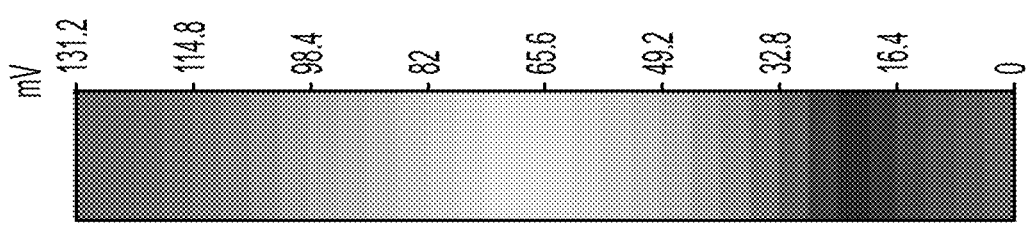

In some embodiments, a wafer-level probe systems may be placed on the one or more edges of a photonic substrate to test the uniformity with which the various parts of the system receive power. This approach is useful for quickly testing the wafer-level system because it requires no irreversible special packaging process. The probe systems can be removed after testing is finished. The approach, however, has a drawback because the amount of power supplied drops from the probed side of the wafer by distance. As a result, the photonic modules closest to the probe system will receive more power than the photonic modules furthest from the probe system. FIG. 4 shows an example analysis of such power drop through a photonic substrate having 7×7 photonic modules. As shown in this figure, the power distribution is relatively uniform across the photonic substrate, although it drops near the edge on the left-hand side of the photonic substrate and near the upper edge of the photonic substrate.

IV. Methods for Fabricating Photonic Packages

Figure 5:
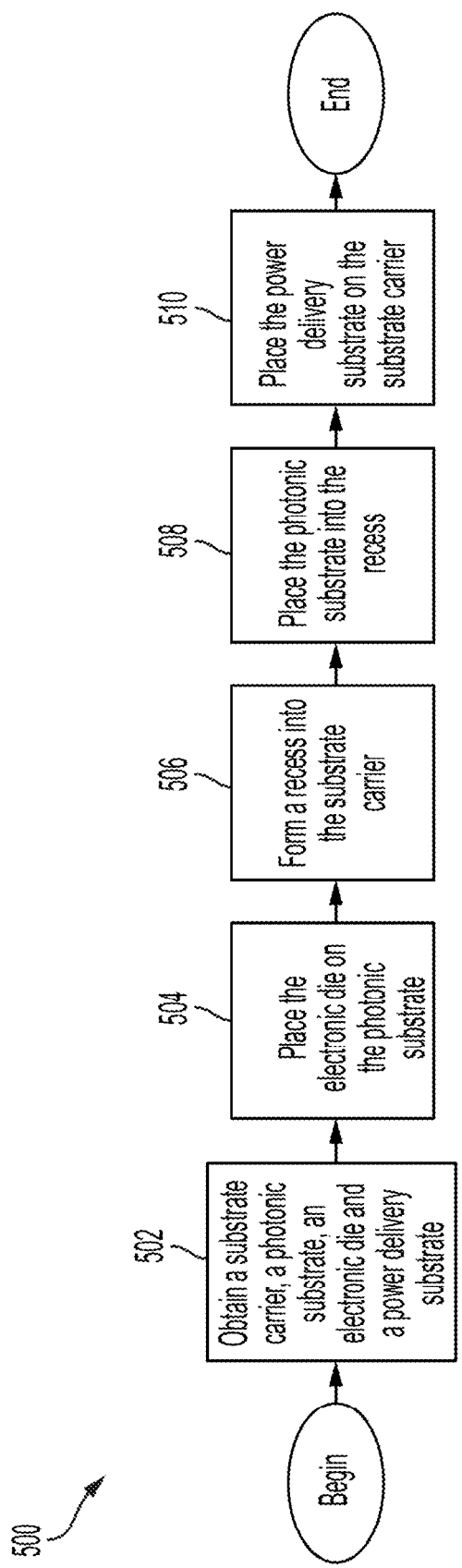
FIG. 5 is a flowchart illustrating a method for manufacturing a photonic package, in accordance with some embodiments.

Some embodiments relate to methods for fabricating photonic packages, including for example the photonic packages described above. FIG. 5 is a flowchart illustrating a representative fabrication method. The steps of method 500 may be performed in the order depicted in FIG. 5 or in any other suitable order.

Method 500 begins at step 502, in which a substrate carrier, a photonic substrate, one or more electronic dies and one or more power delivery substrates are obtained. The power delivery substrate may be, for example, a ceramic laminate substrate. The photonic substrate may have been pre-patterned with a plurality of photonic modules, for example as discussed in connection with FIG. 1B. The electronic die(s) may have been pre-patterned to form memories, processors, or other types of chips. The power delivery substrate(s) may be bridge die(s), interposer(s) or other types of substrate configured to route electric power. The power delivery substrate(s) may have been pre-patterned with vias and conductive traces.

At step 504, the electronic die(s) may be placed on the photonic substrate. In some embodiments, at step 504 the electronic die(s) may be mounted directly on the photonic substrate. In other embodiments, at step 504, an interposer may be mounted on the photonic substrate and the electronic die(s) may be mounted on the interposer. At step 506, a recess is formed into the substrate carrier. This step may be performed, for example, using etching techniques. At step 508, the photonic substrate may be placed in the recess. It should be noted that the photonic substrate may be placed in the recess before or after the electronic die(s) have been placed on the photonic substrate. At step 510, one or more power delivery substrates (e.g., interposers and/or bridge dies) may be placed in part on the photonic substrate and in part on the substrate carrier in such a way as to being configured to convey power to the electronic die(s).

V. Conclusion

Having thus described several aspects and embodiments of the technology of this application, it is to be appreciated that various alterations, modifications, and improvements will readily occur to those of ordinary skill in the art. Such alterations, modifications, and improvements are intended to be within the spirit and scope of the technology described in the application. It is, therefore, to be understood that the foregoing embodiments are presented by way of example only and that, within the scope of the appended claims and equivalents thereto, inventive embodiments may be practiced otherwise than as specifically described. In addition, any combination of two or more features, systems, articles, materials, and/or methods described herein, if such features, systems, articles, materials, and/or methods are not mutually inconsistent, is included within the scope of the present disclosure.

Also, as described, some aspects may be embodied as one or more methods. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified.

The terms "approximately" and "about" may be used to mean within ±20% of a target value in some embodiments, within ±10% of a target value in some embodiments, within ±5% of a target value in some embodiments, and yet within ±2% of a target value in some embodiments. The terms "approximately" and "about" may include the target value.

What is claimed is:

1. A photonic package comprising:
   a substrate carrier having a first surface and a second surface opposite the first surface;
   a plurality of contact pads disposed on the first surface of the substrate carrier;
   a first plurality of electrical connections extending from the plurality of contact pads through the substrate carrier;
   a photonic substrate disposed on the substrate carrier;
   an electronic die; and
   an interposer, disposed between the photonic substrate and the electronic die, having a second plurality of electrical connections coupled with the first plurality of electrical connections, the second plurality of electrical connections comprising:
     a first subset of the second plurality of electrical connections extending from the first plurality of electrical connections on a first side of the interposer to a second side of the interposer and configured to convey electric power from the substrate carrier to the electronic die; and
     a second subset of the second plurality of electrical connections extending from the first plurality of electrical connections on the first side of the interposer to the photonic substrate on the first side of the interposer and configured to convey electric power from the substrate carrier to the photonic substrate.

2. The photonic package of claim 1, further comprising:
   a power delivery substrate, wherein the interposer is disposed between the substrate carrier and the power delivery substrate.

3. The photonic package of claim 2, wherein:
   the first subset of the second plurality of electrical connections convey electric power from the first plurality of electrical connections to the electronic die through the power delivery substrate.

4. The photonic package of claim 3, wherein:
   the power delivery substrate is next to the electronic die.

5. The photonic package of claim 1, wherein:
   the substrate carrier comprises a recess, and the photonic substrate is disposed within the recess of the substrate carrier.

6. The photonic package of claim 5, wherein:
a first portion of the interposer is disposed on the substrate carrier and a second portion of the interposer is disposed on the photonic substrate.

7. The photonic package of claim 1, wherein:
the interposer is configured to distribute heat between the electronic die and photonic substrate.

8. A photonic package comprising:
a substrate carrier having a first plurality of electrical connections extending through the substrate carrier and coupled with a plurality of contact pads disposed on the substrate carrier;
a photonic substrate disposed over the substrate carrier;
an electronic die disposed over the photonic substrate; and
an interposer configured to convey electric power to the electronic die and the photonic substrate by:
using a second plurality of electrical connections within the interposer to convey electric power from the first plurality of electrical connections to the electronic die and photonic substrate, wherein:
a first subset of the second plurality of electrical connections extending from the first plurality of electrical connections on a first side of the interposer to a second side of the interposer is configured to convey electric power from the substrate carrier to the electronic die; and
a second subset of the second plurality of electrical connections extending from the first plurality of electrical connections on the first side of the interposer to the photonic substrate is configured to convey electric power from the substrate carrier to the photonic substrate.

9. The photonic package of claim 8, wherein:
the interposer is disposed between the electronic die and the photonic substrate.

10. The photonic package of claim 8, further comprising:
a power delivery substrate disposed on the interposer.

11. The photonic package of claim 10, wherein:
the first subset of the second plurality of electrical connections are configured to convey electric power to the electronic die through the power delivery substrate.

12. The photonic package of claim 10, wherein:
the power delivery substrate is next to the electronic die.

13. The photonic package of claim 8, wherein:
the substrate carrier comprises a recess, and the photonic substrate is disposed within the recess of the substrate carrier.

14. The photonic package of claim 13, wherein:
the interposer is disposed on a first portion of the substrate carrier on a first side of the recess and a second portion of the substrate carrier on a second side of the recess, opposite the first side, and is continuous over the recess from the first portion of the substrate carrier to the second portion of the substrate carrier.

15. The photonic package of claim 8, wherein:
the electronic die is a first electronic die, the photonic package further comprising a second electronic die;
the photonic substrate comprises first and second photonic modules, the first electronic die being disposed on the first photonic module and the second electronic die being disposed on the second photonic module.

16. The photonic package of claim 15, wherein:
the interposer is further configured to convey electric power to the second electronic die.

17. The photonic package of claim 15, wherein:
the first photonic module and the second photonic module have at least one common layer pattern.

18. The photonic package of claim 15, wherein:
the first electronic die has a first height, and the second electronic die has a second height, wherein the first height is greater than the second height.

19. The photonic package of claim 15, further comprising:
a lid covering the photonic substrate wherein the lid is in thermal contact with the first and second electronic dies.

* * * * *